United States Patent [19]

Kasai et al.

[11] Patent Number: 5,408,483
[45] Date of Patent: Apr. 18, 1995

[54] LASER BEAM EMITTING DEVICE WITH SELECTIVE LASER BEAM POWER OUTPUT LEVEL

[75] Inventors: Toshio Kasai; Hiroto Watanabe; Yoshiyuki Araki, all of Tokyo, Japan

[73] Assignee: Asahi Kogaku Kogyo Kabushiki Kaisha, Tokyo, Japan

[21] Appl. No.: 107,166

[22] Filed: Aug. 17, 1993

[30] Foreign Application Priority Data

Aug. 28, 1992 [JP] Japan .................. 4-065760 U

[51] Int. Cl.$^6$ ................................ H01S 3/10
[52] U.S. Cl. .......................... 372/31; 372/38
[58] Field of Search .................. 372/29, 31, 38

[56] References Cited

U.S. PATENT DOCUMENTS

| | | | |
|---|---|---|---|
| 4,727,382 | 2/1988 | Negishi et al. | 346/108 |
| 4,748,633 | 5/1988 | Negishi | 372/38 |
| 4,761,659 | 8/1988 | Negishi | 346/108 |
| 4,802,179 | 1/1989 | Negishi | 372/38 |
| 4,879,459 | 11/1989 | Negishi | 250/205 |
| 5,119,360 | 6/1992 | Minakuchi | 369/116 |
| 5,153,871 | 10/1992 | Minakuchi | 369/116 |
| 5,255,276 | 10/1993 | Tabuchi et al. | 372/31 |

*Primary Examiner*—James W. Davie
*Attorney, Agent, or Firm*—Sandler, Greenblum & Bernstein

[57] ABSTRACT

A laser beam emitting device is provided for use, for example, in a laser beam printer. The device includes a single laser diode for emitting a laser beam having an output power level that is dependent on a driving current supplied to the laser diode. Two laser diode drivers are connected to the single laser diode and can be individually energized to drive the single laser diode to emit a laser beam that can have different output power levels. A selector is connected to the drivers for producing one of a plurality of selecting signals corresponding to the different output power levels, respectively, to select and energize one of the drivers.

16 Claims, 2 Drawing Sheets

LASER BEAM EMITTING DEVICE WITH SELECTIVE LASER BEAM POWER OUTPUT LEVEL

FIELD OF THE INVENTION

The present invention relates to a laser beam emitting device having a laser beam source. More particularly, the present invention relates a switching system for switching between a plurality of different laser beam output power levels selectively produced by the laser beam source.

BACKGROUND OF THE INVENTION

Laser beam emitting devices, for use as laser beam sources in laser beam printers or the like, produce a laser beam to form desired images on a charged photoconductive drum. The drum then rotates; picking up toner to develop a toner image. The toner image is then transferred to a recording sheet or medium, such as paper through a heating process. The image is then fixed on the recording medium. The diameter of the dots that form the image on the recording sheet corresponds to the diameter of the laser beam. If a constant output power level laser beam is employed to generate dots on a sheet, then since the dots that are printed on a sheet are of the same diameter, they may overlap each other resulting in the printed characters or images not being sharply defined; this problem is particularly acute for very small or complex character or image patterns that are printed on the sheet.

One recent laser beam emitting device is capable of emitting different laser beam output power levels and is capable of selecting one of the output power levels depending on the size or complexity of a character or image pattern which is to be printed. If tile character or image pattern to be printed on a sheet is smaller or more complex, a smaller laser beam output power is selected to produce smaller dots on a sheet.

There has been proposed a control device for use with a driver for energizing a laser diode used as a laser beam source in a laser beam emitting device. The control device outputs a control signal which controls the driver to select one of a plurality of different currents to be supplied to the laser diode so as to produce properly sized dots for the character or image pattern to be printed.

However, the proposed control device has the disadvantage that a certain time delay is introduced when the driver selects one of the different currents to be supplied to the laser diode, and the laser beam output power level produced by the laser diode tends to become unstable during the time period immediately after the driver has selected one of the different currents. During such a time delay or period of laser beam output power level instability, the laser beam emitting device is incapable of emitting a laser beam at the desired output power level. Therefore, when the laser diode is frequently switched to different currents during high-speed printing, for example, the laser beam emission from the laser diode cannot respond quickly to the control signal from the control device. Therefore the speed at which printing may be done must be reduced. As a consequence, the laser beam emitting device is unable to quickly produce, the desired dot diameters, and thus high-quality printed copies cannot be produced, especially during high-speed printing.

SUMMARY OF THE INVENTION

In view of the foregoing, it is therefore an object of the present invention to provide a laser beam emitting device with a switching system for switching between a plurality of different laser beam output power levels from a single laser beam source, to allow high-quality printed copies to be produced during high-speed printing.

According to an aspect of the present invention, there is provided a laser beam emitting device comprising:
  a single laser beam emitting means;
  a plurality of drive means for driving the laser beam emitting means to emit a laser beam, each of the plurality of drive means capable of being operated independently, each of the plurality of drive means driving the laser beam emitting means at a different output power level; and
  a selecting means for producing one of a plurality of selecting signals to individually select one of the plurality of drive means.

According to another aspect of the present invention, there is provided a laser beam emitting device comprising:
  a single laser beam emitting means;
  a pair of drive means, each one of the drive means capable of being operated independently, each one of the drive means being individually selectable such that the laser beam emitting means emits a laser beam having an output power level that is dependent on the selected drive means; and
  a selecting means connected to the pair of drive means for individually selecting each one of the drive means with a corresponding selecting signal.

DESCRIPTION OF THE ACCOMPANYING DRAWINGS

DESCRIPTION OF THE EMBODIMENT

Figure 1:
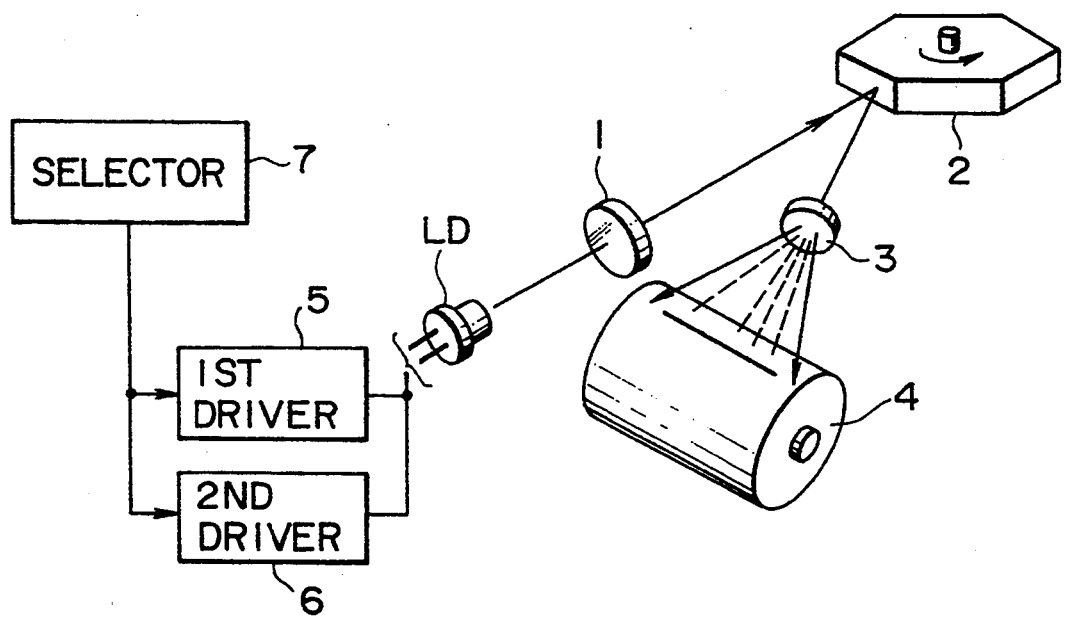
FIG. 1 is a schematic perspective view, partly in block diagram form, of a laser beam emitting device according to the present invention, as incorporated in a laser beam printer.

As shown in FIG. 1, a laser beam emitting device embodying the present invention, which is incorporated in a laser beam printer, has a single laser diode LD as a laser beam source for emitting a laser beam. The laser beam emitted by the laser diode LD is applied to a focusing optical system 1, such as a lens, and then passes through the focusing optical system 1 to a polygonal mirror 2 that is rotating about its own axis. The laser beam is reflected by the polygonal mirror 2, and passes through an fθ lens 3 to a photosensitive drum 4. Since the polygonal mirror 2 rotates about its own axis, the laser beam is periodically deflected to scan the photosensitive surface of the photosensitive drum 4 in one direction.

The laser diode LD is connected to first and second laser diode drivers 5, 6 which can be individually selected by a selector 7 based on a modulated signal and a selecting signal which are applied to the selector 7.

Figure 2:
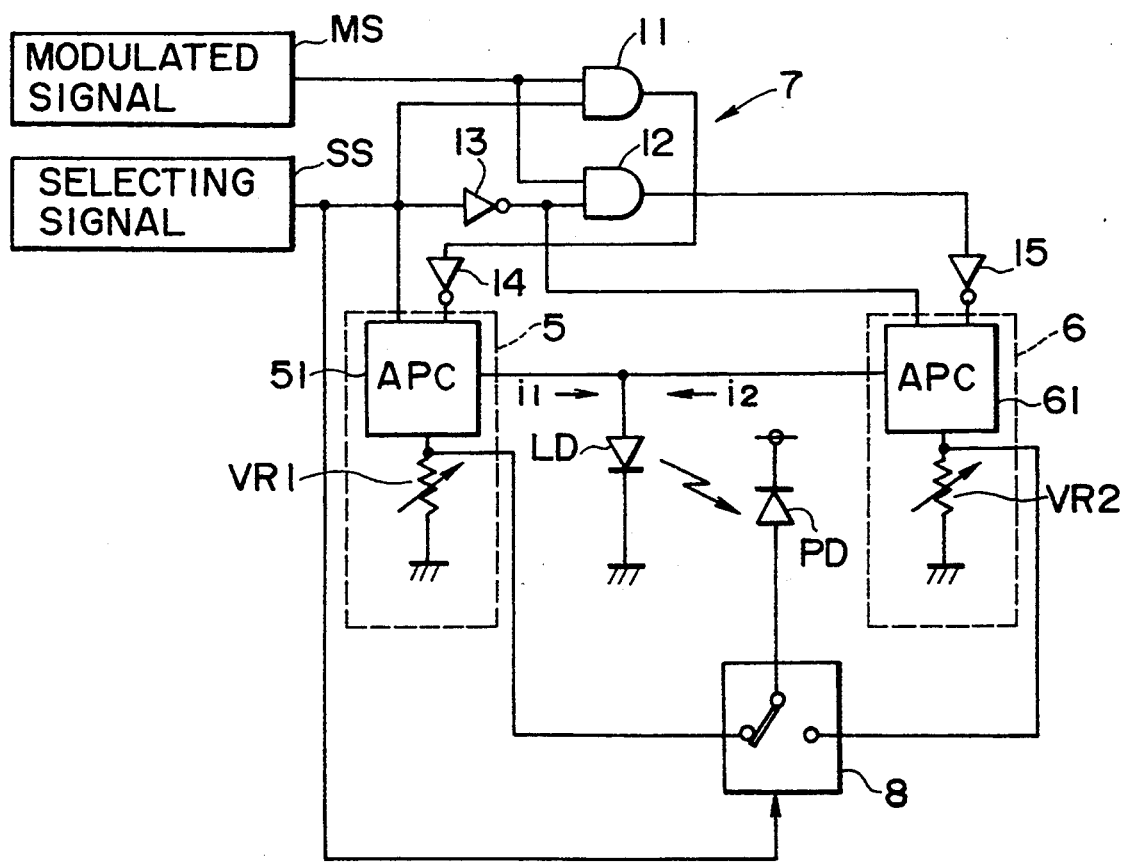
FIG. 2 is a block diagram of a switching system of the laser beam emitting device shown in FIG. 1.

FIG. 2 shows in block form the first and second laser diode drivers 5, 6 and the selector 7. As shown in FIG. 2, the selector 7 comprises two AND gates 11, 12 and three inverters 13, 14, 15. The AND gate 11 is supplied with a modulated signal MS and a selecting signal SS. The AND gate 12 is supplied with the modulated signal MS and the selecting signal SS that is inverted by the inverter 13. The AND gate 11 produces an output signal which is applied through the inverter 14 to the laser diode driver 5. The AND gate 12 produces an output signal which is applied through the inverter 15 to the laser diode driver 6.

Figure 3:
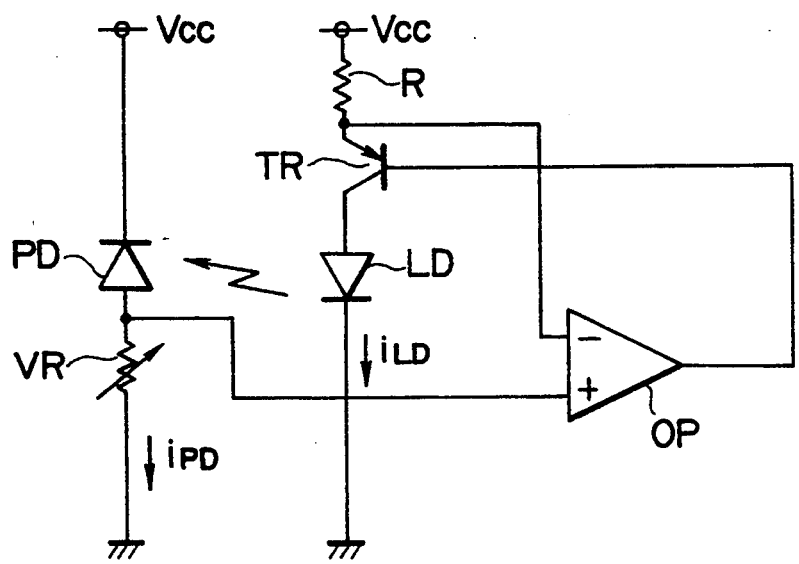
FIG. 3 is a circuit diagram of an automatic power control circuit of the switching system shown in FIG. 2.

The laser diode drivers 5, 6 each have automatic power control (APC) circuits 51, 61, respectively, for stabilizing the output power level from the laser diode LD. Each of the APC circuits 51, 61 has a circuit arrangement as shown in FIG. 3. In FIG. 3, each APC circuit comprises a photodiode PD for detecting the laser beam emitted from the laser diode LD, a variable resistor VR for varying the detected current $i_{PD}$ flowing through the photodiode PD, and an operational amplifier OP for comparing the voltage at a terminal of the variable resistor VR, i.e., a feedback voltage, with the voltage at a terminal of a resistor R that is connected in series with the laser diode LD, and for controlling a transistor TR that is connected in series with the laser diode LD in order to control the driving current applied to the laser diode LD based on the compared voltages. The variable resistor VR is indicated by VR1 for the laser diode driver 5 and VR2 for the laser diode driver 6 in FIG. 2.

When the resistance of the variable resistor VR is varied, the detected current $i_{PD}$ flowing through the photodiode PD is varied and, hence the voltage applied to one input terminal of the operational amplifier OP is varied. Therefore, the driving current $1_{LD}$ supplied to the laser diode LD is also varied, thus varying the output power level of the laser diode LD.

As shown in FIG. 2, the output current from the photodiode PD can be supplied to either of the laser diode drivers 5, 6 through a selector switch 8 that can be shifted over by the selecting signal SS, synchronized with the switching between the laser diode driver 5 and laser diode driver 6.

While the circuit arrangements of the APC circuits 51, 61 of the laser diode drivers 5, 6 are identical to each other, the variable resistors VR1, VR2 of the laser diode drivers 5, 6 are set to different resistances. Since the variable resistors VR1, VR2 are set to different resistances, when one of the laser diode drivers 5, 6 is selected by the selecting signal SS, the laser diode LD can be switched to a output power level setting corresponding to the selected laser diode driver.

Figure 4:
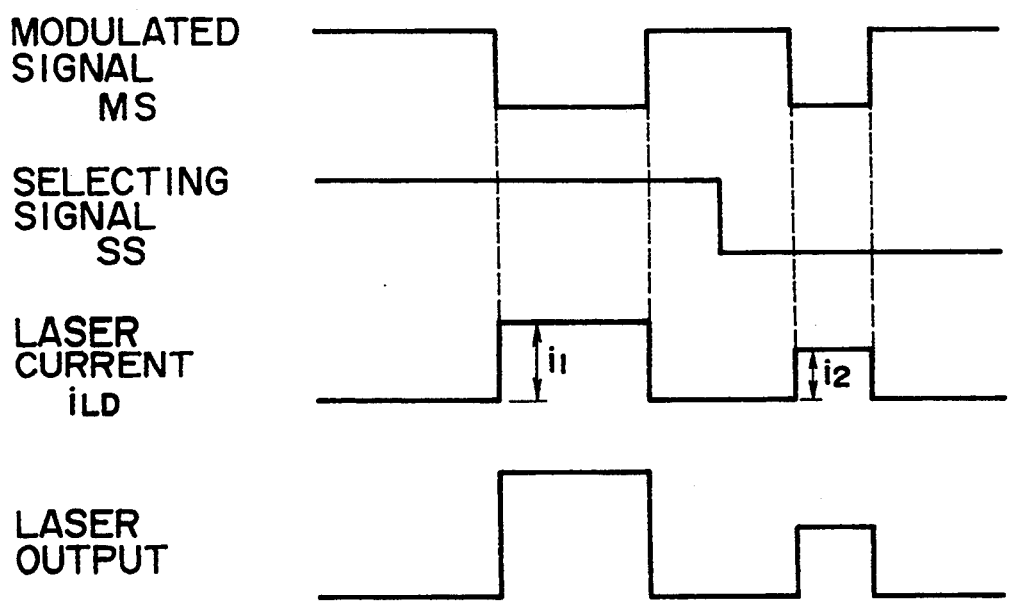
FIG. 4 is a timing chart of signals that is illustrative of the manner in which the switching system operates.

When the modulated signal MS, which is a rectangular wave, and the selecting signal SS, as shown in FIG. 4, are applied to the selector 7, only one of the AND gates 11, 12 produces an output signal, which is inverted by the inverter 14 or 15, selecting one of the laser diode drivers 5, 6. In the example shown in FIG. 4, the first laser diode driver 5 is selected when the selecting signal SS is high, and the second diode driver 6 is selected when the selecting signal SS is low. The selector switch 8 is also shifted over by the selecting signal SS to selectively connect the photodiode PD to the APC circuits 51, 61 of the laser diode drivers 5, 6.

The variable resistors VR1, VR2 of the laser diode drivers 5, 6 are set to different resistances, as described above. Therefore, when the laser diode driver 5 is selected, the detected current $i_{PD}$ from the photodiode PD has a higher value $i_1$, for example, as determined by the variable resistor VR1, and the APC circuit 51 operates accordingly to increase the output power level of the laser beam emitted from the laser diode LD. When the laser diode driver 6 is selected, the detected current $i_{PD}$ from the photodiode PD has a lower value $i_2$, for example, as determined by the variable resistor VR2, and the APC circuit 61 operates accordingly to reduce the output power level of the laser beam emitted from the laser diode LD.

Since the laser diode drivers 5, 6 have been set to produce predetermined laser diode driving currents, the laser beam emitting device, according to the present invention, can respond more quickly to the selecting signal SS and hence can switch more quickly between different laser beam output power levels than if the driving current supplied to the laser diode was varied by a single laser diode driver. The laser beam emitting device is also effective in preventing the laser beam emission from becoming unstable immediately after a different driving current has been selected to drive the laser diode LD. Therefore, even when the laser diode LD is frequently switched to different currents, the laser beam emitted from the laser diode LD can respond quickly to the selecting signal SS. As a result, the laser beam emitting device according to the present invention permits a laser beam printer to produce high-quality printed copies at a high printing speed.

While the laser beam emitting device in the illustrated embodiment has two laser diode drivers 5, 6, it may have three or more laser diode drivers which can be individually selected.

The present disclosure relates to a subject matter contained in Japanese Utility Model Application No. HEI 4-065760, filed on Aug. 28, 1992, which is expressly incorporated herein by reference in its entirety.

What is claimed is:

1. A laser beam emitting device comprising:
laser beam emitting means;
a plurality of drive means for driving said laser beam emitting means to emit a laser beam, each of said plurality of drive means capable of independently setting a predetermined output power level of said laser beam emitting means, each of said plurality of drive means driving said laser beam emitting means to emit said laser beam at different output power levels; and
selecting means for producing one of a plurality of selecting signals to individually select one of said plurality of drive means.

2. The laser beam emitting device according to claim 1, wherein said laser beam emitting means comprises a single laser diode, each of said plurality of drive means having automatic power control means for stabilizing the output power level of said laser beam emitted by said laser beam emitting means.

3. The laser beam emitting device according to claim 2, further comprising switch means, that is actuated in response to one of said selecting signals produced by said selecting means, for feeding a signal corresponding to the output power level of said laser beam to a selected one of said plurality of drive means.

4. The laser beam emitting device according to claim 3, wherein each of said plurality of drive means has resistance means, the output power level of said laser beam emitting means being dependent on a resistance value of said resistance means.

5. The laser beam emitting device according to claim 1, each of said plurality of drive means being prepared to drive said laser beam emitting means whether selected or not selected by said selecting means.

6. The laser beam emitting device according to claim 5, wherein said laser beam emitting means comprises a single laser diode, each of said plurality of drive means having an automatic power control means for stabilizing said output power level of said laser beam emitted by said laser beam emitting means.

7. The laser beam emitting device according to claim 6, further comprising switch means, actuated in response to said selecting signals produced by said selecting means, for feeding a signal corresponding to said output power level of said laser beam emitted by said laser beam emitting means.

8. The laser beam emitting device according to claim 7, each of said plurality of drive means comprising variable resistance means, said output power level of said laser beam emitting means being dependent on a resistance value of said resistance means.

9. A laser beam emitting device comprising:
laser beam emitting means;
a pair of drive means, each of said drive means capable of independently setting a predetermined output power level of said laser beam emitting means, each of said drive means being individually selectable such that said laser beam emitting means emits a laser beam having an output power level corresponding to said selected drive means; and
selecting means connected to said pair of drive means for individually selecting each one of said drive means with a corresponding selecting signal.

10. The laser beam emitting device according to claim 9, wherein said laser beam emitting means comprises a single laser diode, each of said pair of drive means having automatic power control means for stabilizing the output power level of said laser beam emitted by said laser beam emitting means.

11. The laser beam emitting device according to claim 10, further comprising switch means, which is actuated by said selecting means for feeding a signal corresponding to the output power level of said laser beam emitted by said laser beam emitting means to one of said pair of drive means selected by said selecting means.

12. The laser beam emitting device according to claim 11, wherein each one of said pair of drive means has a resistance means, the output power level of said laser beam emitting means being dependent on a resistance value of said resistance means.

13. The laser beam emitting device according to claim 9, each of said plurality of drive means being prepared to drive said laser beam emitting means whether selected or not selected by said selecting means.

14. The laser beam emitting device according to claim 13, wherein said laser beam emitting means comprises a single laser diode, each of said plurality of drive means having an automatic power control means for stabilizing said output power level of said laser beam emitted by said laser beam emitting means.

15. The laser beam emitting device according to claim 14, further comprising switch means, actuated in response to said selecting signals produced by said selecting means, for feeding a signal corresponding to said output power level of said laser beam emitted by said laser beam emitting means.

16. The laser beam emitting device according to claim 15, each of said plurality of drive means comprising variable resistance means, said output power level of said laser beam emitting means being dependent on a resistance value of said resistance means.

* * * * *